United States Patent [19]

Auston

[11] 3,917,943

[45] Nov. 4, 1975

[54] PICOSECOND SEMICONDUCTOR ELECTRONIC SWITCH CONTROLLED BY OPTICAL MEANS

[75] Inventor: David Henry Auston, Mountainside, N.J.

[73] Assignee: Bell Telephone Laboratories, Incorporated, Murray Hill, N.J.

[22] Filed: Nov. 21, 1974

[21] Appl. No.: 525,886

[52] U.S. Cl. .................................. 250/211 J; 357/30

[51] Int. Cl.$^2$ .......................................... H01J 39/12

[58] Field of Search ........ 250/211 R, 211 J; 357/29, 357/30; 136/89; 350/96 WG

[56] References Cited

UNITED STATES PATENTS

| | | | |
|---|---|---|---|
| 2,402,662 | 6/1942 | Ohl | 136/89 |
| 2,641,713 | 6/1953 | Shive | 250/211 R |
| 2,790,088 | 4/1957 | Shive | 250/211 J |
| 3,378,738 | 4/1968 | McIver | 357/30 |
| 3,809,953 | 5/1974 | Nishizawa | 357/30 |

OTHER PUBLICATIONS

"Semiconductor Devices," by J. Shine, 1959, pp. 136–138.

*Primary Examiner*—James W. Lawrence
*Assistant Examiner*—D. C. Nelms
*Attorney, Agent, or Firm*—D. I. Caplan

[57] ABSTRACT

A microstrip transmission line on the surface of a photoconductive semiconductor medium has a small gap, thereby producing an open circuit between a microwave (or other electrical signal) source and a detector connected at opposite ends of the line. This gap is suddenly filled (and the microwave circuit thereby completed) by copious electrical charges which are generated in a semiconductor surface region across the gap, in response to a first pulse of optical radiation characterized by a picosecond rise time and by a wavelength which is substantially completely absorbed at the surface of the semiconductor medium. Accordingly, this first pulse produces a correspondingly sharp rise in the microwave energy (switch-"ON") reaching the detector. Within a few picoseconds thereafter (while the electrical charges due to the first pulse still persist), a second optical pulse, which is also characterized by a picosecond rise time but of a wavelength which is absorbed into the bulk of the semiconductor medium, is directed at the gap sufficient to increase significantly the conductance across the gap, thereby short-circuiting the microwave line to a ground plane on the opposed major surface of the semiconductor. Accordingly, the second pulse produces a correspondingly sharp decline (switch-" OFF") in the microwave energy reaching the detector from the microwave source.

14 Claims, 1 Drawing Figure

PICOSECOND SEMICONDUCTOR ELECTRONIC SWITCH CONTROLLED BY OPTICAL MEANS

FIELD OF THE INVENTION

This invention relates to the field of semiconductor apparatus, and more particularly to optically controlled semiconductor devices for high speed switching of electrical signals.

BACKGROUND OF THE INVENTION

In the prior art, it has been possible to switch microwaves on and off by using, for example, ferrite devices controlled by magnetic fields (excited by electrical currents) or by using semiconducotor PIN diode devices controlled by electrical pulses. However, microwave switching times are thereby limited to the order of 100 nanoseconds for the ferrite devices and of the order of one nanosecond for the semiconductor PIN diode devices, while the microwave power handling capacity of these PIN diode devices is limited to about 1 watt. Moreover, whereas semiconductor tunnel diode devices have also been used for switching D.C. electrical signals, the switching speeds which have been attained with such tunnel diodes are at best 25 picoseconds; and these diodes are limited to the switching of signals whose amplitudes are less than a few volts. On the other hand, there is a need for faster electrical switching times for such applications as ranging radar in order to obtain better resolution of the range information, as well as for fast switching pulses for fast computer operation. While optically controlled semiconductor devices have previously been suggested for microwave switchings as well as electrical signal pulse generation purposes, these devices have not yielded switching times as fast as desired for many of these applications. Accordingly, it would be desirable to have an optically controlled electrical switch capable of the order of picosecond switching times.

SUMMARY OF THE INVENTION

An optical source is selected for producing a pair of optical beams, each of rather limited wavelength spread, typically substantially monochromatic. Each beam is advantageously characterized by a sharp rise time, of the order of picoseconds or less. The wavelength of the first beam is selected such that it is substantially completely absorbed at the surface, rather than in the bulk, of a selected high resistivity photoconducting semiconductor material; whereas the wavelength of the second beam is selected such that it is absorbed in the bulk of the semiconductor. A body of the selected semiconductor material has a pair of opposed major surfaces, on one of which is located a ground plane and on the other of which is located a broken electrode microstrip transmission line, that is, a microstrip with a gap in the line. Advantageously the semiconductor body is monocrystalline, in order to ensure uniformly high bulk resistivity and is characterized by a uniformly high resistivity which is sufficient to cause the semiconductor to behave as a dielectric with respect to electrical signals propagating along the microstrip transmission line. The first optical beam is directed at the gap, thereby generating copious electronic charges at the surface of the semiconductor sufficient to increase significantly the conductance across the gap, and thus closing the electrical circuit at the gap between the broken portions of the electrode microstrip line. Advantageously, this optical beam is sufficiently intense to cause a sudden decrease of the d.c. resistance along the semiconductor surface across the gap to a value well below the characteristic impedance of the microstrip transmission line. The microstrip transmission line circuit is thereby closed (switched ON), enabling electrical signals to pass from an input electrical generator to an output electrical detector located at opposite ends of the microstrip line. Then, a short predetermined time interval after commencement of the first optical beam, the second optical beam is directed at the gap in the microstrip line. This second beam thereby causes the generation of copious electronic charges in the bulk of the semiconductor body down to the ground plane. The microstrip line at the gap is thus short-circuited to the ground plane (switched OFF), quickly terminating the flow of electrical signal energy from the input electrical generator to the output electrical detector.

In a specific embodiment of the invention, a monocrystalline body of high resistivity silicon semiconductor (about $10^4$ ohm cm) has a ground plane in physical contact with one of a pair of opposed major surfaces of the body. A microstrip transmission line is situated physically contacting the other of the opposed major surfaces. The microstrip line has a gap which ordinarily produces an open circuit in the line. One of the ends of the microstrip line is coupled to a microwave source (or other electrical signal generator) and the other end of the line is terminated in a microwave (or other electrical signal) detector. A laser source of an optical infrared radiation beam of wavelength about 10,600 angstroms is characterized by a rise time of about three picoseconds or less, although longer rise time can also be used. A portion of the laser beam is directed through an optically nonlinear crystal to produce a second harmonic (5,300 angstroms) optical beam, whereas the remainder of the fundamental (10,600 angstrom) optical beam is subjected to a predetermined relative time delay (longer optical path). Both the second harmonic beam and the delayed fundamental optical beam are directed at the microstrip gap. The second harmonic beam is first to arrive on the silicon body surface at the gap in the microstrip, so that the second harmonic optical radiation is absorbed only at the surface of the silicon in the neighborhood of the gap. Accordingly, the second harmonic (5,300 angstrom) beam closes the electrical circuit in the microstrip line (switch-ON), thereby enabling the flow of microwave signal energy between the microwave signal generator and the microwave signal detector. Subsequently, the (time-delayed) 10,600 angstrom beam (optionally while the first beam still persists) arrives on the silicon body surface at the gap, in order to short-circuit the microstrip line to the ground plane and thereby suddenly suppress (switch-OFF) the microwave flow between the microwave generator and detector. Thus, the microwave flow to the detector is in the form of a pulse whose width in time is essentially the predetermined time delay of the fundamental optical beam relative to the second harmonic optical beam.

BREIF DESCRIPTION OF THE DRAWING

This invention together with its advantages, features and objects may be better understood from the following detailed description when read in conjunction with the drawing in which:

FIG. 1 is a cross-section diagram of an optically controlled semiconductor microwave switch, in accordance with a specific embodiment of the invention, FIG. 2 is a perspective view diagram of an optically controlled semiconductor microwave switch, in accordance with another specific embodiment of the invention; and FIG. 3 is a plan view diagram of an optically controlled electrical waveform sampling device, in accordance with yet another specific embodiment of the invention.

For the sake of clarity only, none of the drawings is to scale.

DETAILED DESCRIPTION

Figures 1, 2, 3:
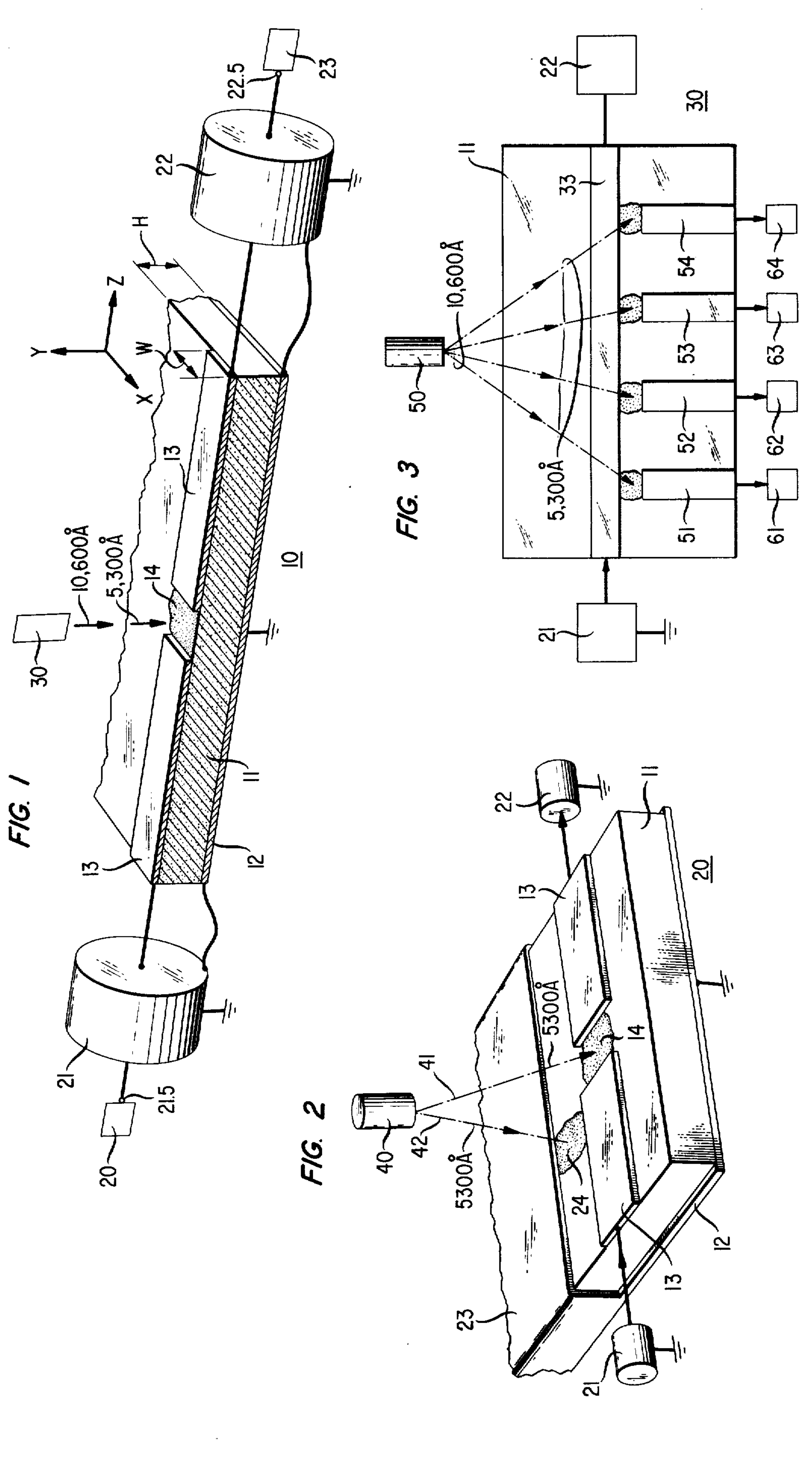

As shown in FIG. 1, a microwave switch 10 includes a typically rectangularly shaped monocrystalline semiconductor body 11 which is provided on its bottom surface with a ground plane electrode 12 and on its top surface with a microstrip transmission line electrode 13 having a gap 14. This gap is typically of length about 0.3mm in the Z direction between the two segments of the electrode. The electrode 13 is advantageously an aluminum strip having a thickness in the range of 500 to 10,000 angstroms, typically 5,000 angstroms. The ground plane electrode is also aluminum with a similar thickness. It is important that the electrodes 12 and 13 both make good ohmic (nonrectifying) contact with the semiconductor 11. To this end, heat treatment of the aluminum electrodes on the surface of the semiconductor at about 550° C in nitrogen for about 10 minutes can be utilized; or else other methods and other electrode materials for achieving ohmic contact can be used, as known in the art. A microwave generating input transducer 21 is controlled by an input terminal 21.5 for feeding in power from an energy source 20. The input transducer 21 supplies typically 1 to 10 GHz microwave signals of about 100 volts or more in amplitude, and is connected to one end of the microstrip line 13. Thereby, the microwave energy from the input transducer 21 can be propagated by the microstrip line 13 to a microwave-detecting output transducer 22 having an output terminal 22.5 for feeding the output from transducer 22 to utilization means 23. The body 11 is typically made of P-type, or alternatively N-type, semiconductive silicon having a substantially uniform and a relatively high bulk resistivity of approximately $10^4$ ohm-cm. However, resistivities as low as $10^2$ ohm-cm are also useful, particularly when using smaller dimensions for the body 11 in the Z direction. The body 11 extends in the longitudinal z direction typically for about 1 cm, and typically also for about 1 cm in the transverse $x$ direction. The thickness H of the body 11 is typically about 0.25 mm for the propagation of electromagnetic waves in the range of frequency of d.c. to the order of 100 GHz. More generally, H should be selected to be less than the quantity $c/4(\Delta f)(\epsilon-1)^{1/2}$, where $c$ is the speed of light in vacuo, $\Delta f$ is the pulse bandwidth or carrier frequency itself whichever is greater, and $\epsilon$ is the dielectric constant of the semiconductor body 11 relative to the vacuum. The width W (in the $x$ direction) of the microstrip line 13 is for example about 0.8H (0.2mm or less) to produce a characteristic impedance of about 50 ohms, which is advantageously about the same impedance as the characteristic impedance of the gap 14 in the presence of a 5,300 angstrom optical beam to be described presently, thereby minimizing disadvantageous microwave reflections during operation (which would undesirably increase the switching time). The ground plane 12 typically coats the entire bottom surface of the body 11. The electrode material for both the microstrip line 13 and the ground plane 12 is mirrors aluminum, although metallic or metal-like conductors such as gold or silver can also be used for the purpose.

An optical source 30, typically including an infrared laser, provides substantially monochromatic pulsed output radiation of pulse widths in the range of 3 to 10 picoseconds (or less). These optical pulses typically are characterized by a wavelength of 10,600 angstroms (1.06 microns). The source 30 further contains a beam splitter (not shown for clarity) which splits the beam into two branches. In one of the branches an optical second harmonic generator is located in the path of the beam, in order to generate radiation of wavelength 5,300 angstroms (0.53 microns). The respective optical path lengths of the two branches are arranged, by means of suitably located mirror or other conventional means, so that the optical path of the fundamental 10,600 angstrom radiation beam is longer than that of the second harmonic 5,300 angstrom beam. The paths of these beams are then cojoined so that both beams are directed and focused onto the semiconductor at the microstrip gap 14, the commencement of a pulse of the 10,600 angstrom beam at the gap being delayed by a time interval T relative to that of the 5,300 angstrom beam, owing to the above mentioned difference in optical path length delays. This time interval T is typically selected to be greater than the reciprocal of the frequency of the microwaves to be switched by the device 10.

In response to the 5,300 angstrom beam, copious charge carriers are first generated in a thin surface semiconductor region; so that a layer of high electrical conductivity silicon is first produced at the gap by the 5,300 angstrom beam, as indicated by the shaded surface region of the body 11 at the gap 14. The production by the 5,300-angstrom beam of this surface region of high conductivity thereby enables microwave energy to propagate across the device 10 from the input transducer 21 to the output transducer 22; that is, the 5,300 angstrom beam switches-ON the device 10. Thereafter, commencing at time T later, the 10,600-angstrom optical beam produces copious charge carriers in the bulk of the silicon under the gap 14, thereby short-circuiting the microstrip line to the ground plane 12 and thus ending the microwave propagation from transducer 21 to transducer 22, that is, switching-OFF the device 10.

The $xz$ cross sections of both the optical beams are advantageously adjusted to fill the entire gap 14 with radiation. For such a gap, optical pulse energies of two or three or more microjoules at 5,300 angstroms (a few millijoule per $cm^2$) are sufficient to produce a significantly higher conductance of a few $(ohm)^{-1}$, an increase in conductance by a factor of the order of $10^5$, thereby electrically closing the microwave circuit across the gap. However, the gap 14 can range in length ($z$ - direction) between about 0.01 mm and 1.0 mm, in conjunction with similar optical pulse intensities and with proportionally scaled microstrip width and silicon body thickness. The time delay T is selected to be the desired pulse width of the output microwave pulse. The requisite optical pulse at 10,600 angstrom for shorting the microwave gap to the ground plane is likewise only a few microjoules of optical energy, typically about 5 microjoules.

Advantageously, the laser in the optical source 30 is adjusted to produce a pulse of optical radiation of about 10,600 angstrom wavelength having a 3 to 10 picosecond or less rise time, as known in the art of solid state lasers, such as a mode-locked neodymium-doped glass laser. On the other hand, the second harmonic radiation beam at 5,300 angstroms (having the same rise time) can be generated by directing a portion of the fundamental 10,600 angstrom beam through a potassium dihydyrogen phosphate (KDP) crystal. The 5,300-angstrom radiation beam is absorbed substantially at the surface, rather than in the bulk, of the silicon semiconductor body 11 at the gap 14, thereby temporarily providing high conductivity electrical connection between the microstrip electrodes 13 at the gap 14. On the other hand, the 10,600-angstrom radiation beam is absorbed substantially in the bulk of the silicon, thus short-circuiting either or both ends of the microstrip line 13 at the gap to the ground plane 12, and thereby switching off the propagation of microwaves from the input transducer 21 to the output transducer 22. Thus, it is important that H, the thickness of the body 11, should be less than the absorption length of the fundamental optical radiation (about 1 mm, for silicon with respect to 10,600-angstrom radiation).

It should be stressed that the silicon semiconductor material of the body 11 should be of sufficiently high bulk resistivity, advantageously of the order of at least about $10^4$ ohm cm. In this way the attenuation length in the silicon of microwaves of the order of 1 to 10 GHz will be of the order of at least 50 cm, which is advantageously much larger than the length of the microstrip transmission line 13. Thereby, the high resistivity silicon behaves as a dielectric (except at the gap 14 in the presence of optical excitation) with respect to the propagating microwave energy.

With this high bulk resistivity selected for the silicon, the dielectric relaxation time ($\epsilon/\sigma$) of the charge carriers produced in the silicon at the gap 14 is of the order of $10^{-13}$ to $10^{-14}$ seconds in the presence of the optical pulses. Therefore, this relaxation time does not impose a serious limitation on the establishment of a current path of high electrical conductivity across the gap. Thus, the 5,300 angstrom optical pulse even in the absence of the 10,600-angstrom optical pulse, will enable microwave radiation to flow across the gap 14 for the duration of this 5,300-angstrom optical pulse plus the charge carrier lifetimes (of the order of microseconds). Accordingly, the 10,600-angstrom optical pulse (for switching-OFF) is not needed in cases where the desired control of microwave flow can be achieved solely with the 5,300-angstrom optical radiation, that is, where switch-OFF is not important or it can be achieved by other means such as the natural recombination of the charge carriers (of the order of microseconds). It should be noted, however, that the relatively long charge carrier lifetime, of the order of microseconds, imposes a corresponding upper limit, of the order of megahertz, upon the repetition rate (of complete ON-OFF cycles) of the device 10. This repetition rate may be increased by adding, for example, gold as an impurity dopant in the silicon, of the order of $10^{17}$ gold atoms per $cm^3$ to increase the repetition rate to the order of gigahertz. Thus, an initial second harmonic 5,300 angstrom pulsed optical beam with a 10 picosecond pulse width will cause the gap 14 to be electrically conducting (switched-ON) for as long as $10^{-6}$ to $10^{-9}$ seconds thereafter, depending upon the gold doping concentration, unless the fundamental 10,600 angstrom beam intervenes sooner to short-circuit (switch-OFF) the microstrip to ground. Accordingly, the pulsed fundamental beam can in some desired applications commense even after the second harmonic optical pulse has ended (i.e., while the charges due to the first pulse still persist).

It should be remarked that the gap 14 has a capacitance of the order of $10^{-14}$ farads in the absence of optical radiation, so that there will be a leakage "dark" current background, but at most a few percent of the ON currents enabled by the 5,300 angstrom beam for propagating electromagnetic wave frequencies as high as 10 GHz. For still higher frequencies, the smaller limits of the ranges of values of W and H (FIG. 1) should be used.

For improved ON-OFF ratio, the microstrip line 13 can have two or more gaps (instead of just a single gap), thereby forming a plurality of breaks in the microwave transmission circuit, upon each of which is incident an optical beam containing a suitable fundamental and second harmonic sequence.

The output signal of the device 10 feeding the output transducer 22 can be as large as 100 volts or more, with an output to input voltage ratio of 90 to 95 percent. For certain applications, the utilization means 23 can be connected directly to the output end of the microstrip line electrode 13, resulting in similar voltage signal size and efficiency.

FIG. 2 illustrates another embodiment of the invention. Many of the elements of FIG. 2 are similar to those previously described in conjunction with FIG. 1; and accordingly these similar elements are labeled with the same reference numerals in FIG. 2 as in FIG. 1. The embodiment shown in FIG. 2, however, relies upon a different mechanism for turning off the device 20. Specifically, an optical laser source 40 provides a 5,300 angstrom beam 41 incident on the gap 14 and another 5,300 angstrom beam 42 incident on a gap region 24 located between the segmented electrode 13 and an auxiliary grounded electrode layer 23. The beam 41 at the gap region 14 switches ON the device 20 (similarly as in FIG. 1); the switching OFF is accomplished by the relatively time-delayed 5,300 angstrom beam 42, which commences to strike the gap 24 while the beam 41 is still incident on the gap 14, thereby short-circuiting the microstrip line 13 to the grounded electrode 23. This delay of the commencement of the beam 42 will then control, and be equal to, the microwave pulse width observed at the detecting transducer 22. The beam 42 incident on the gap 24, in a manner similar to the beam 41 incident on the gap 14, produces a surface charge region electrically connecting the line 13 to the grounded electrode 23, which now serves to short-circuit the propagation of microwave energy from the input transducer 21 to the output transducer 22, thereby switching OFF the device 20.

The distance between the grounded electrode layer 23 and the microstrip transmission line 13 is typically about equal to the microstrip width itself. The grounded electrode 23 advantageously extends in the direction away from the microstrip 13 many times the width of microstrip 13 itself, in order that the electrode layer 23 should furnish a good microwave ground for the strip 13. The characteristic impedance of the microstrip line 13 in the presence of the electrode layer 23 will be somewhat different from what it was in FIG. 1, due to mutual coupling, as known in the art. However, the same impedance can be achieved, if desired, by moderate changes in the geometry of strip 13, also as known in the art. It should be remarked that microstrip 13 can alternatively be situated along an end of the top surface of the body 11, and can be grounded by an optical beam of 5,300 angstroms which strikes the edge (side) surface of the body 11 and creates copious surface charges at the edge sufficient to short-circuit the microstrip 13 to the ground plane 12 by reason of these edge surface charges.

FIG. 3 illustrates a top plan view diagram of yet another embodiment of the invention. Again, elements in FIG. 3 which are similar to those in FIG. 1 are labeled with the same reference numerals. FIG. 3 shows a device 30 for sampling of microwaves propagating along a main microstrip transmission line 33. The microstrip line 33 is similar to the microstrip line 13 (FIG. 1) except that the line 33 is not itself segmented, but the device 30 further includes auxiliary microstrip lines 51–54, each separated by a similar gap from the main line 33. These auxiliary lines 51–54 are terminated in detecting transducers 61–64, respectively. An optical source 50 provides a multiplicity of optical beams, each incident on a different gap between the different auxiliary lines 51–54 and the main line 33. Each of the beams includes a 5,300 angstrom pulsed beam component and a delayed 10,600 angstrom pulsed component, just as supplied by the source 30 (FIG. 1) previously described. Accordingly, each of the 5,300 angstrom beams will connect the main line 33 to the corresponding one of the auxiliary lines 51–54, thereby enabling each auxiliary line to become temporarily responsive to the instantaneous amplitude of microwave energy then propagating along the main line in the neighborhood of the corresponding auxiliary line; whereas the 10,600 angstrom beams will subsequently short-circuit the main line to the ground plane (not shown in FIG. 3) located on the underside of the body 11 as in FIG. 1, thereby simultaneously disabling the response of all the auxiliary lines to the main line.

Typically, the 5,300 angstrom beam components are adjusted so that they all arrive at their respective gaps simultaneously; and all the 10,600 angstrom beams likewise are adjusted to arrive at the respective gaps simultaneously but commencing at a predetermined time delay after the arrival of the 5,300 angstrom beams. Thereby, the detecting transducers 61–64 will sense the corresponding microwave amplitudes at each gap only during the time slots (intervals) between the commencement of the 5,300 angstrom and the 10,600 angstrom beam components. Since there is a finite velocity of propagation of microwaves along the main line 33, each of the detecting transducers 61–64 will sample a different microwave amplitude corresponding to the (earlier) time variations of input microwave amplitude supplied by the microwave-generating transducer 21. In such a case, the time delay between the 10,600 and 5,300 angstrom should be less than the microwave, propagation time along the main line 33 between the next neighboring auxiliary microstrips. Thus the device 30 functions as a type of real time sampling oscilloscope which can substantially instantaneously sample the waveform of electrical signals propagating along the main line. Other arrangements, adjustments and variations of auxiliary microstrips and pulsed optical beams are also feasible for modified operation, as should now be obvious to the worker in the art.

It should be remarked that the silicon body 11 in the device 10 can operate in an environment having a temperature ranging between about 2° Kelvin and about 800° Kelvin. For somewhat lower values of optical beam intensity, temperatures between 2° and 80° Kelvin are useful.

Although this invention has been described in detail in terms of specific embodiments, various modifications can be made without deparing from the scope of the invention. For example, other semiconductive materials can be used for the body 11, such as gallium arsenide, germanium, gallium phosphide of cadmium sulphide, or other high resistivity photoconductor, in conjunction with other lasers in the source 30 such as dye lasers excited by argon ion lasers, or gallium arsenide and other semiconductor diode lasers advantageously using minimum sized microstrip gaps (for minimum laser power). Some of the foregoing semiconductor materials for the body 11 have lower charge recombination times than silicon, and hence can provide faster repetition rates. It should be understood that the invention may also be practiced with generators 21 of millimeter waves or other types of electromagnetic radiation or signals having any desired time variations including d.c. which are to be switched by the device 10, 20, or 30. For d.c. switching, the time interval T between the commencement of the two optical beams can be as small as possible compatible with the electrical conductivity response of these devices to the switch ON optical beams, to wit ($\epsilon/\sigma$), of the order of $10^{-13}$ seconds or less. However, other factors, such as geometrical parameters, may restrict the response to one picosecond.

What is claimed is:

1. Apparatus comprising
   a. a body of semiconductor having a major surface upon which is located a pair of electrode segments separated by a gap;
   b. optical source means for directing a first beam of radiation at said gap sufficient to produce charge carriers at the surface of the semiconductor, which thereby significantly increase the electrical conductivity across the gap and electrically complete a contact between said segments, and for directing a second beam of radiation on the body commencing at a predetermined time after said first beam has commenced, which is sufficient to produce electronic charge carriers in the bulk of the semiconductor sufficient to short-circuit at least one of the segments to a ground plane in contact with the body.

2. Apparatus recited in claim 1 in which the first beam is an harmonic of the second beam.

3. Apparatus recited in claim 1 in which the body is silicon of uniformly high bulk electrical resistivity.

4. Apparatus for switching electrical signals which comprises:
   a. a body of semiconductor of substantially uniform electrical high resistivity having a major surface upon which is situated a microstrip transmission line electrode having at least one gap thereby dividing the strip line into at least two electrode segments;

b. a ground plane electrode situated on an opposed major surface of the body;

c. optical source means for directing a first beam of optical radiation onto the major surface of the body at said gap sufficient to produce charge carriers at said surface which cause a substantially lower electrical resistance in a surface region of the body between said segments, the wavelength components of said first beam being such that optical radiation thereof is absorbed in the body within a distance of the major surface which is substantially less than the thickness of the body between the stirp line and the ground plane at the gap.

5. Apparatus recited in claim 4 which further includes optical source means for directing a second beam of optical radiation onto the body at said gap sufficient to produce charge carriers in the bulk of the body at the gap which cause a short-circuiting electrical path between at least one of the electrode segments and the ground plane.

6. Apparatus according to claim 4 in which the body is silicon and the first beam has an optical wavelength of about 5,300 angstroms.

7. Apparatus according to claim 4 in which the electrode strip line has at least two gaps, and in which the optical source directs the first optical beam at one of the gaps commencing at a predetermined time before said source directs a similar optical beam at another of the gaps.

8. The method of switching an electrical microstrip transmission line which comprises the step of:

directing a first optical beam at a gap dividing the microstrip line into segments, the microstrip located on the surface of a body of semiconductor, the wavelength and intensity of the beam being sufficient to generate electrical charge carriers at the surface of the semiconductor across said gap whereby the segments are electrically connected together through the semiconductor body, thereby enabling the flow of electrical signals across the gap.

9. The method of claim 8 which further includes the subsequent step of:

directing a second optical beam at the gap commencing at a predetermined time delay after the commencement of the first beam, the wavelength and intensity of the second beam being sufficient to generate electrical charge carriers in the bulk of the material thereby short-circuiting at least one of the segments to a ground plane situated on a surface of the material opposite from the surface on which the strip line is situated.

10. The method recited in claim 9 in which the wavelength of the first beam is the second harmonic of that of the second beam and in which the semiconductor material is semiconductive silicon.

11. Apparatus which comprises:

a. a body of high resistivity semiconductor having a major surface;

b. a microstrip transmission line located on the major surface, said microstrip having at least one gap dividing the microstrip into at least two segments;

c. a ground plane electrode located on the said major surface spaced apart from the microstrip;

d. means for directing a first optical beam at said gap sufficient to produce sufficient charge carriers at the semiconductor surface across the gap to increase significantly the electrical conductance across the gap, thereby enabling the flow of electrical signals across the gap.

12. Apparatus according to claim 11 which further comprises means for directing a second optical beam at the major surface in a region centered between the microstrip and the ground plane sufficient to produce sufficient charge carriers at the semiconductor surface to increase significantly the electrical conductance between the microstrip and the ground plane, thereby short-circuiting the microstrip to ground.

13. Apparatus which comprises:

a. a body of high resistivity semiconductor material having a pair of opposed major surfaces;

b. a ground plane electrode located on one of said opposed surfaces;

c. a main microstrip transmission line electrode located on the other surface;

d. a plurality of auxiliary microstrip transmission line electrodes located on the said other surface, each of said plurality of auxiliary electrodes extending from the neighborhood of a different point on the main line, thereby defining a gap on the said other surface between each auxiliary line and the main line.

14. Apparatus according to claim 13 which further comprises means for directing beams of optical radiation at said gaps sufficient to produce sufficient charge carriers at the semiconductor surface at the gaps to increase significantly the electrical conductance at the gaps.

* * * * *